(12) United States Patent
Adams et al.

(10) Patent No.: US 6,815,757 B2
(45) Date of Patent: Nov. 9, 2004

(54) SINGLE-POLY EEPROM ON A NEGATIVELY BIASED SUBSTRATE

(75) Inventors: Reed W. Adams, Plano, TX (US); William E. Grose, Plano, TX (US); Sameer Pendharkar, Richardson, TX (US); Roland Bucksch, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/349,066

(22) Filed: Jan. 22, 2003

(65) Prior Publication Data

US 2004/0140497 A1 Jul. 22, 2004

(51) Int. Cl.[7] .................................... H01L 29/788
(52) U.S. Cl. .................. 257/315; 257/321; 257/322; 257/401; 438/176; 438/197; 438/594
(58) Field of Search ............................ 257/315, 321, 257/322, 401; 438/176, 197, 594

(56) References Cited

U.S. PATENT DOCUMENTS

| 5,089,433 A | * | 2/1992 | Anand et al. |
| 5,192,872 A | * | 3/1993 | Lee ............................ 257/315 |
| 6,172,397 B1 | * | 1/2001 | Oonakado et al. .......... 257/321 |

* cited by examiner

*Primary Examiner*—Eddie Lee
*Assistant Examiner*—Thomas Magee
(74) *Attorney, Agent, or Firm*—Rose Alyssa Keagy; W. James Brady, III; Frederick J. Telecky, Jr.

(57) ABSTRACT

Disclosed are devices and associated methods for manufacturing an EEPROM memory cell (10) for use on a negatively biased substrate (12). The invention may be practiced using standard semiconductor processing techniques. Devices and methods are disclosed for a floating gate transistor for use as an EEPROM cell (10) including a DNwell (14) formed on a P-type substrate (12) for isolating the EEPROM cell (10) from the underlying P-type substrate (12).

12 Claims, 3 Drawing Sheets

SINGLE-POLY EEPROM ON A NEGATIVELY BIASED SUBSTRATE

TECHNICAL FIELD

The invention relates to electronic semiconductor devices, and more particularly, to devices and methods for forming an EEPROM cell on a negatively biased substrate. The invention may be practiced using standard semiconductor processing techniques.

BACKGROUND OF THE INVENTION

A popular form of nonvolatile memory known in the arts is the single polysilicon EEPROM (Electrically Erasable Programmable Read Only Memory). EEPROMs are a convenient and versatile form of nonvolatile memory that, under appropriate operating conditions, can be programmed, erased, and reprogrammed thousands of times.

In general, a single polysilicon EEPROM structure includes four distinct elements defined here for the discussion below: the floating gate, the control gate, the tunneling region, and the read transistor. The floating gate, as the term is used herein, is defined as the entire length of polysilicon which extends over the read transistor, or sense FET read channel, the control gate, and the tunneling region. The floating gate extends into two diffusions in scaled proportions forming a ratio of a larger capacitor to a smaller capacitor. The control gate is defined by the diffusion forming the lower plate of the larger capacitor with respect to the floating gate in the capacitor ratio. The tunneling region is defined by the diffusion forming the lower plate of the smaller capacitor with respect to the floating gate in the capacitor ratio. The floating gate crosses over a third diffusion region where it forms the gate of the read transistor. The terminals of the EEPROM device are the control gate, the tunneling region, and the read transistor source, drain, and backgate nodes. The floating gate is not considered a terminal in the discussion below because it can not be directly accessed as a floating node.

A single polysilicon EEPROM typically uses a variant of a MOSFET with two gates, a diffused control gate and a polysilicon floating gate not electrically connected to any other part of the circuit. Before the EEPROM memory cell is programmed, no charge exists on the floating gate and the read transistor operates as an enhancement mode transistor. To program the device, a large voltage is applied to the control gate while all other terminals are grounded. The large voltage of the control gate creates an electric field in the insulating oxide between the floating gate and the read transistor channel and between the floating gate and tunneling region. This field attracts electrons from the substrate. Thus, a negative charge accumulates on the floating gate.

The negative charge that accumulates on the floating gate reduces the strength of the electric field in the oxide until it is incapable of contributing more electrons to the floating gate. The charge becomes trapped on the floating gate and the device is said to be in a "programmed state". Once programmed, the charge trapped on the floating gate causes electrons to be repelled from the surface of the substrate. Thus the threshold voltage of the device is raised significantly above that of the device in an unprogrammed state. Once programmed, the floating gate retains its trapped charge even when the power supply is off. Extrapolated experimental data indicates that an EEPROM device may remain in the programmed state for many years.

To erase the device, a large voltage is applied to the tunneling region while all other terminals are grounded. The large voltage of the tunneling region creates an electric field in the insulating oxide between floating gate and tunneling region. This field attracts electrons from the floating gate. Thus, a positive charge (absence of electrons) accumulates on the floating gate.

The positive charge that accumulates on the floating gate reduces the strength of the electric field in the oxide until it is incapable of removing more electrons from the floating gate. Positive charge becomes trapped on the floating gate and the device is said to be in a "erased state". Once erased, the charge trapped on the floating gate causes electrons to be attracted to the surface of the substrate. Thus the threshold voltage of the device is reduced significantly below that of the device in an unprogrammed state. Once erased, the floating gate retains its trapped charge even when the power supply is off. Extrapolated experimental data indicates that an EEPROM device may remain in the erased state for many years.

Reading the EEPROM device is accomplished by applying a gate-to-source voltage above the threshold voltage for an erased device and below the threshold voltage for a programmed device. At the drain terminal of the read transistor, an erased device conducts electricity, and a programmed device does not, allowing the stored data value to be determined. An EEPROM device can be electrically erased and subsequently reprogrammed.

Characteristically EEPROM devices used in the arts have employed a grounded substrate and a grounded SNwell diffusion capacitor plate and are capable of storing programmed data for years. In applications having a negative potential difference between the SNwell capacitor plates and the substrate however, significant problems are encountered. In an EEPROM cell on a negatively biased substrate, the probability of electron injection from the substrate into the oxide is greatly increased. The injected electrons form an electric field which counteracts the positive charge stored on the floating gate of an erased cell, thus causing data loss in a matter of hours or days. Attempts to address this problem have included using polysilicon fuses for long-term nonvolatile data storage. This approach however has serious limitations in terms of reliability due to variations in individual fuses and their "blowing" characteristics, including the possibility that a polysilicon fuse may regrow over time. Another attempted solution known in the arts is to use level-shifting of data into and out of standard EEPROM cells so that data is stored away from negatively biased substrate conditions. Major disadvantages of this approach include increased circuit complexity and the greater area required for the additional level-shifting circuits. It would be useful and advantageous in the arts to provide an EEPROM device capable of reliably storing data in applications having a negative bias on the substrate.

SUMMARY OF THE INVENTION

In general, the invention provides an EEPROM cell for use on a negatively biased substrate and associated methods of manufacturing. The EEPROM is isolated from the underlying substrate by an interposing DNwell.

According to one aspect of the invention, a method of making a floating gate transistor for use as an EEPROM cell includes steps of forming a DNwell in a P-type substrate and forming an isolated EEPROM cell on the DNwell.

According to another aspect of the invention, a method of making an EEPROM cell for use on a negatively biased substrate includes a step of forming a buried N-type layer (NBL), followed by a step of depositing a P-type epitaxial layer. Further steps include the formation of a DNwell in the P-type substrate. The DNwell includes a void in the center over the NBL pattern such that the DNwell forms an enclosure fully contacting the perimeter of the NBL, providing an isolated P-type region. The DNwell also underlies the tunneling region, floating gate region, and control region and is electrically coupled to a fixed DC voltage or ground. Further steps include the formation of a first SNwell in the DNwell to create a tunneling region and a first capacitor. A second SNwell is formed in the DNwell of the control region with a second capacitor and control gate. A sense transistor is formed on the isolated P-type region. Steps for forming oxide layers over the cell are followed by the formation of a polysilicon floating gate on the oxide layers. Standard CMOS processing steps follow to complete the EEPROM cell.

According to still another aspect of the invention, a representative embodiment of a floating gate transistor for use as an EEPROM cell incorporates a P-type substrate with an isolating DNwell configured for accepting an EEPROM cell, and an EEPROM cell formed on the DNwell.

According to yet another aspect of the invention, an embodiment of an EEPROM cell formed on a negatively biased substrate has a P-type substrate with a DNwell formed on the substrate defining a tunneling region, floating gate region, and control gate region. The DNwell is electrically coupled to ground and isolates the layers disposed thereon from the substrate. Included are a first SNwell on the tunneling region of the DNwell and a second SNwell on the control gate region. A capacitor is disposed on the first SNwell, a control gate on the second SNwell, and a sense transistor is disposed on the floating gate region of the DNwell. An oxide layer over the DNwell is topped by a polysilicon floating gate operable to program the EEPROM cell.

According to another aspect of the invention, the width of at least a portion of the DNwell may be controlled to accommodate an anticipated substrate bias level.

Technical advantages are provided by the invention, including but not limited to the capability for providing reliable EEPROM cells on a negatively biased substrate using standard semiconductor processing technologies. The invention thus provides an improved EEPROM cell on a negatively biased substrate which is reliable, small in size, and economical. These and many other advantages related to the improvements of the invention will become apparent to persons skilled in the relevant arts through careful reading of the disclosure and claims presented herein.

BRIEF DESCRIPTION OF THE DRAWINGS

For a better understanding of the invention including its features, advantages and specific embodiments, reference is made to the following detailed description along with accompanying drawings in which:

FIG. 1A is a top view of an example of a substrate with a DNwell and NBL defining an isolated P-type region therein according to a preferred embodiment of the invention;

FIG. 1B is a top view of the substrate of FIG. 1A showing an example of the formation of SNwells and moats according to a preferred embodiment of the invention;

FIG. 1C is a top view of the substrate of FIG. 1B showing an example of the further steps in the formation of an EEPROM cell according to a preferred embodiment of the invention;

FIG. 1D is a top view of an example of a preferred embodiment of a completed EEPROM cell of the invention;

Figure 1A:
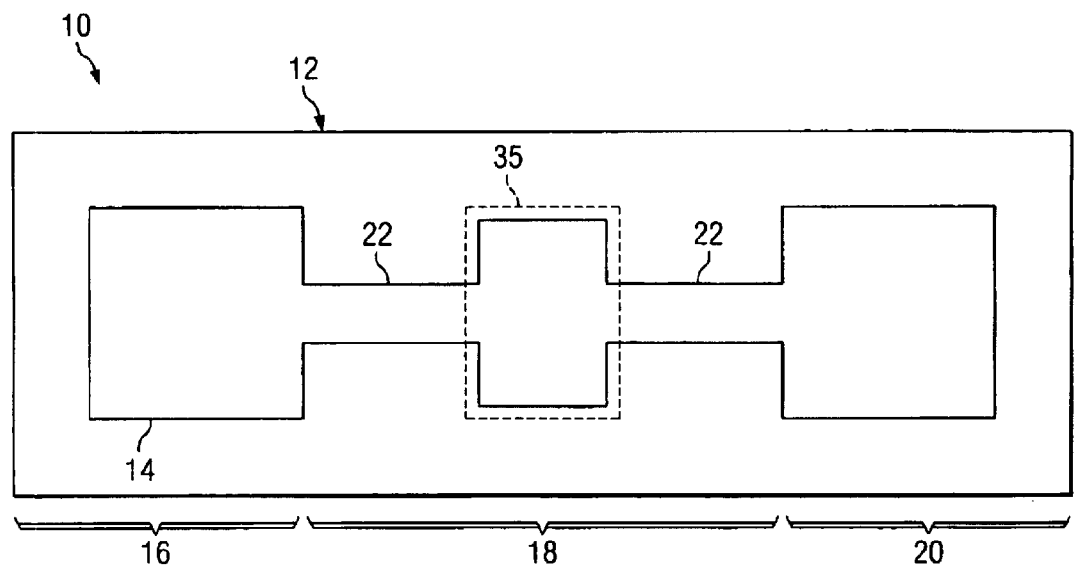
FIGS. 1A–1D illustrate examples of steps in a preferred method of manufacture of an EEPROM cell according to the present invention.

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. It should be understood that the invention may be practiced using available semiconductor device manufacturing processes without altering the principles of the invention.

In general, an EEPROM memory cell typically includes a silicon substrate, an oxide layer, and a polysilicon layer. Those skilled in the arts will appreciate that many memory cells may be constructed on a single substrate and that, in principle, a memory device may include innumerable individual EEPROM cells. FIG. 1A through FIG. 1D illustrate an example of an EEPROM cell 10 and method of manufacture according to a preferred embodiment of the invention.

The EEPROM design described makes use of multiple diffusions of N-type material in a P-type substrate. Both SNwell and DNwell diffusions are described in the exemplary descriptions below. The term "Snwell" references a Shallow N-well diffusion, while "DNwell" references a Deep N-well diffusion, such that the DNwell is driven deeper into the substrate than the SNwell. It is also noted here that the DNwell is defined to have a lower doping concentration than that of the SNwell.

An overview of an example of methods of making an EEPROM cell 10 according to the invention is followed by further description. Referring generally to the Figures, according to a preferred embodiment of the invention, a method of making an EEPROM cell 10 for use on a negatively biased substrate 12 includes the formation of a buried N-type layer (NBL) 35, followed by the deposit of a P-type epitaxial layer as known in the arts. This epitaxy serves as an extension of the surface of the substrate 12 above the NBL 35, and is referred to as the substrate 12 for simplicity. A DNwell 14 is formed in the P-type substrate 12. The DNwell 14 is driven deep enough to make full contact with the previously patterned NBL 35. The DNwell 14 includes a void in the center over the NBL 35 such that the DNwell 14 forms an enclosure fully contacting the perimeter of the NBL 35. The P-type substrate 12 existing in the void of the DNwell 14 provides an isolated P-type region 33. The DNwell 14 surrounds the tunneling region 16, floating gate region 18, and control region 20 and is electrically coupled to a fixed DC voltage or ground. Further steps include the formation of a first SNwell 24 in the DNwell 14 for defining the tunneling region 16. A first capacitor 32 is formed using the first SNwell 24 as the first plate of the first capacitor. A second SNwell 26 is formed in the DNwell 14 of the control region 20. A second capacitor 36 is formed utilizing the second SNwell 26 as the first plate of the second capacitor 36. A control gate i30 s formed from the second SNwell 26. A sense transistor 34 is formed on the isolated P-type region 33. Steps for forming thick and thin oxide layers 38 over the cell 10 are followed by the formation of a polysilicon floating gate 40 on the oxide layers 38. The polysilicon floating gate 40 forms the second plate of the first capacitor 32, the second plate of the second capacitor 32, and the gate of the read transistor 34. Standard CMOS processing steps follow for the completion of the EEPROM cell 10.

FIG. 1A shows a substrate 12 as a starting point for describing the steps of making an EEPROM cell 10 according to the invention. Typically, the substrate 12 is a wafer of monocrystalline silicon material of the P-type prepared by conventional processes. For convenience in illustrating and describing the invention, a relatively small representative portion of substrate 12 is shown. A deep N well, denominated "DNwell" 14 is formed in the upper surface of the substrate 12. The DNwell 14 is configured to define a tunneling region 16, a floating gate region 18, and a control gate region 20. The floating gate region 18 has coupling sections 22 providing a continuous electrical coupling among the respective DNwell 14 regions 16, 18, and 20. Preferably, the DNwell 14 is electrically connected to the "ground" of the EEPROM device. The floating gate region 18 preferably includes an NBL 35 for the formation of a generally coinciding isolated P-type region 33.

Figure 1B:
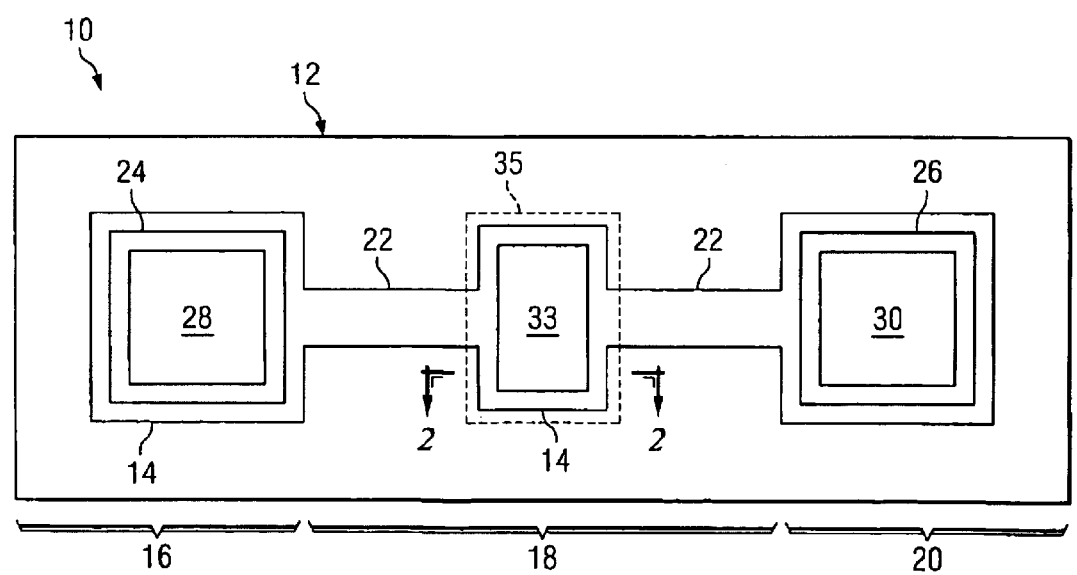
Figure 2:
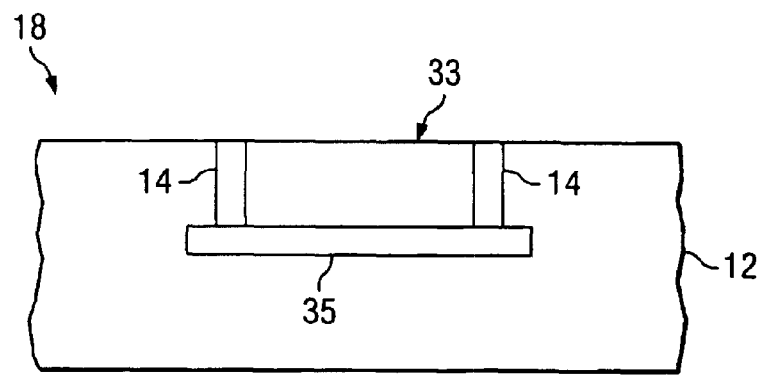
FIG. 2 is a cross-section view showing an example of a P-type region isolated by an NBL in the preferred embodiment of the EEPROM cell of FIG. 1B, taken along line 2—2.
Figure 3:
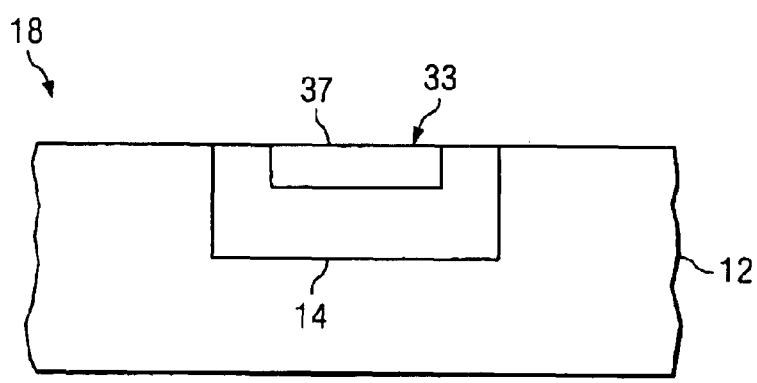
FIG. 3 is a cross-section view of a P-type region isolated by enclosure within a DNwell an EEPROM cell according to an alternative embodiment of the invention.

As representatively illustrated in the example of FIG. 1B, the isolated P-type region 33 is preferably defined using an N-Buried Layer (NBL) 35 as known in the arts. As shown in the example of FIG. 1B, the NBL 35 has a DNwell 14 formed thereon, with an enclosed P-region 33. A cross-section view of the isolated P-type region 33 of FIG. 1B taken along line 2—2 is shown in FIG. 2. Alternative structures and methods may be used so long as an isolated P-type region 33 is provided within the floating gate region 18. For example, illustrated in FIG. 3, a region of shallow P-well material, "SPwell" 37 may be formed in a void of the DNwell 14 within the floating gate region 18, thus providing an isolated P-type region 33. It should be understood that other alternative methods and structures are possible and may be used without departure from the invention so long as an isolated P-type region 33 is provided.

Figure 1C:
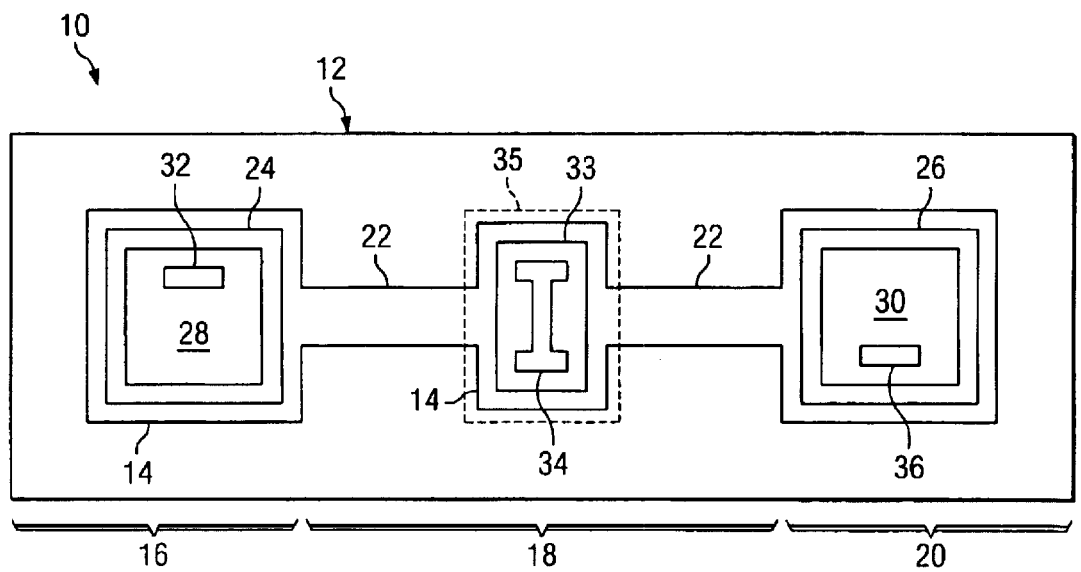

With continued reference to FIG. 1B and to FIG. 1C, a first shallow well of N-type material, "SNwell" 24, is formed on the upper surface of the tunneling region 16 of the DNwell 14. A second SNwell 26 is similarly formed on the upper surface of the control region 20 of the DNwell 14. A first N moat 34 is formed on the upper surface of the isolated P-type region 33. A first P moat 28 and a second P moat 30 are formed on the upper surfaces of the first SNwell 24 and second SNwell 26 respectively. An oxide layer 38 (of FIG. 1D) is grown over the upper surface of the EEPROM memory cell 10.

Figure 1D:
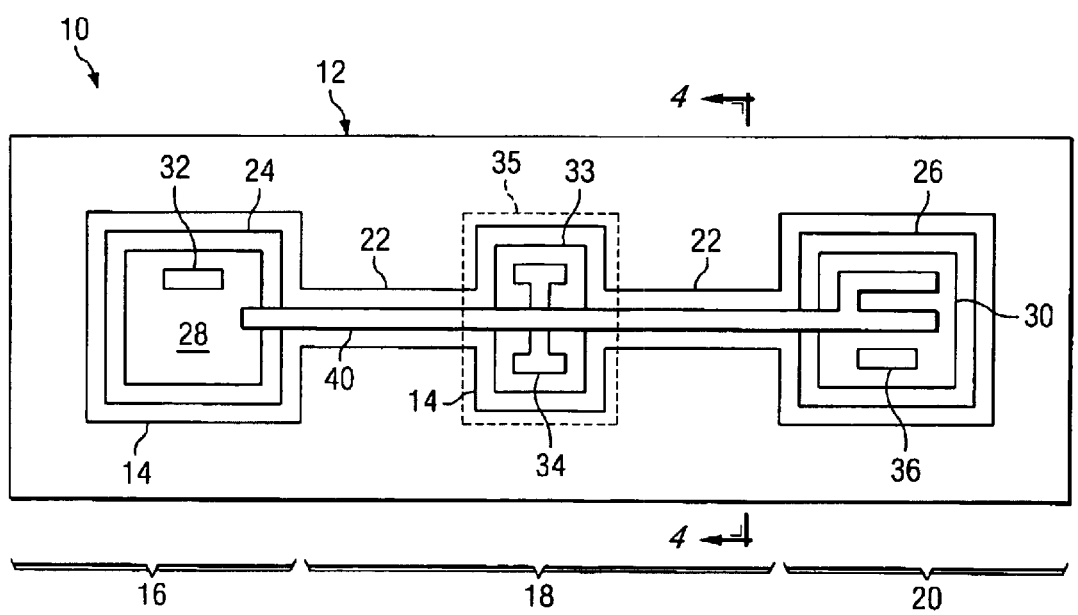

As shown in FIG. 1D, a polysilicon floating gate 40 is formed on the oxide 38 extending into tunneling region 16, control gate region 20 and crossing over sense transistor N-moat 34. It will be apparent to those skilled in the arts that the steps described herein may be performed according to accepted semiconductor device manufacturing techniques. For example, standard processes may be used for masking, patterning, and etching the features shown and described.

Figure 4:
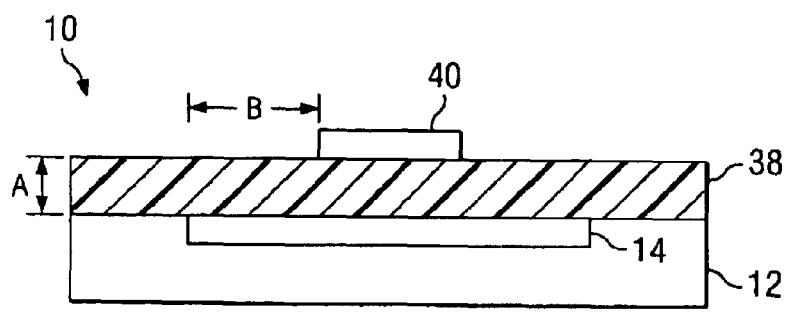
FIG. 4 is a cross-section view of the embodiment of an EEPROM cell of the invention depicted in FIG. 1D taken along line 4—4.

With continued reference primarily to FIGS. 1D and 4, the features of a preferred embodiment of the EEPROM cell 10 of the invention are further described. The DNwell 14 to P substrate 12 junction results in a lower intensity of the electric field than possible with a junction between an SNwell and P substrate due to the lower doping concentration of the DNwell with respect to the SNwell. Thus, by placing the first SNwell 24 underlying the first capacitor 32, the first SNwell 24 to the P substrate 12 junction is eliminated, and the probability of undesirable electron injection into the oxide 38 is substantially reduced. Improved longevity and reliability are realized for the EEPROM cell 10.

FIG. 4 depicts a cross-section view of the EEPROM cell taken along line 4—4 of FIG. 1D. At the coupling portion 22 of the EEPROM cell 10, the P substrate 12 is shown. The upper surface of the DNwell 14 is covered by an insulating oxide layer 38. The polysilicon floating gate 40 is positioned above the DNwell 14. The distance indicated by arrow A is controlled by the thickness of oxide 38. oxide The distance indicated by arrow B is preferably selected based on the magnitude of substrate bias to control the impact on the stored charge of floating gate 40 by the electric field created from injected electrons from the DNwell-substrate junction into oxide 38. This mechanism for controlling the impact of the electric field on the stored charge in the cell allows EEPROM cell parameters to be tailored to the particular application.

By electrically connecting the DNwell 14 to ground, or a constant DC voltage, the potential difference across the parasitic capacitance that exists between the polysilicon floating gate 40 and the underlying DNwell 14 surface does not become strongly negative as a strong negative bias is applied to the P substrate 12. Similarly, a strong positive voltage does not appear when a negative bias is removed from the P substrate 12.

Preferably, the use of a DNwell 14 interposed under the oxide 38 and the polysilicon floating gate 40, provides an increased distance B between the trapped charge of a programmed device and the floating gate 40. This increased distance, e.g., B, results in a reduction of the effect of the electric field created in the oxide 38 by the trapped charge. Moreover, the probability of electron injection from the substrate 12 into the oxide 38 to the floating gate 40 is reduced.

Thus, the use of a DNwell 14 underlying the tunneling region 16, floating gate 18 region, and control region 20 of the EEPROM cell 10 provide increased data reliability and longevity. The use of increased distance between the floating gate 40 and the trapped charge also acts to increase the reliability and longevity of data storage in the EEPROM cell 10. These attributes, singly and in combination, provide improved EEPROM memory cells 10.

The embodiments shown and described above are only exemplary. Even though numerous characteristics and advantages of the present invention have been set forth in the foregoing description together with details of the method and device of the invention, the disclosure is illustrative only and changes may be made within the principles of the invention to the full extent indicated by the broad general meaning of the terms used in the attached claims.

We claim:

1. A method of making a floating gate transistor for use as an EEPROM cell comprising the steps of:
   forming a DNwell on a P-type substrate;
   forming an EEPROM cell on the DNwell wherein the EEPROM cell is isolated from the P-type substrate by the DNwell;
   forming a first SNwell defining a tunneling region within the DNwell;
   forming a capacitor on the first SNwell;
   forming a second SNwell defining a control gate region within the DNwell;
   forming a control gate on the second SNwell; and
   operatively connecting the capacitor and control gate to a read transistor formed in the isolated P-type region.

2. A method of making a floating gate transistor for use as an EEPROM cell according to claim 1 wherein the connecting step further comprises the steps of:
   forming an oxide layer on the tunneling region, sense transistor, and control gate region of the DNwell; and
   forming a polysilicon floating gate on the oxide layer operable to program the EEPROM cell.

3. A method of making an EEPROM cell for use on a negatively biased substrate comprising the steps of:
   forming a DNwell on a P-type substrate, the DNwell defining a tunneling region, floating gate region, and control gate region, the DNwell electrically coupled to a fixed DC voltage;
   forming a first SNwell on the tunneling region within the DNwell;
   forming a capacitor on the first SNwell;
   forming a second SNwell on the control region within the DNwell;
   forming a control gate on the second SNwell;
   forming an isolated P-type region within the floating gate region of the DNwell;
   forming a sense transistor on the isolated P-type region;
   forming an oxide layer on the tunneling region, floating gate region, and control gate region of the DNwell; and
   forming a polysilicon floating gate on the oxide layer operable to program the EEPROM cell.

4. A method of making a floating gate transistor for use as an EEPROM cell according to claim 3 further comprising the step of forming an NBL for isolating the P-type region.

5. A method of making a floating gate transistor for use as an EEPROM cell according to claim 3 further comprising the step of forming an SPwell defining a read transistor location enclosed by the DNwell.

6. A method of making an EEPROM cell for use on a negatively biased substrate according to claim 3 further comprising the step of:
   selecting the width of at least a portion of the DNwell according to an anticipated substrate bias level.

7. A method of making an EEPROM cell for use on a negatively biased substrate according to claim 3 further comprising the step of:
   selecting the width of the floating gate portion of the DNwell according to an anticipated substrate bias level.

8. A floating gate transistor for use as an EEPROM cell comprising:
   a P-type substrate having a DNwell configured for accepting an EEPROM cell;
   an EEPROM cell formed on the DNwell wherein the EEPROM cell is isolated from the P substrate by the DNwell and wherein the EEPROM cell has a floating gate; and
   a capacitor for charging the floating gate wherein the capacitor is disposed on an first SNwell, the first SNwell isolated from the P substrate by the DNwell.

9. A floating gate transistor for use as an EEPROM cell comprising:
   a P-type substrate having a DNwell configured for accepting an EEPROM cell;
   an EEPROM cell formed on the DNwell wherein the EEPROM cell is isolated from the P substrate by the DNwell and wherein the EEPROM cell has a floating gate; and
   a control gate for charging the floating gate wherein the control gate is disposed on an second SNwell, the second SNwell isolated from the P substrate by the DNwell.

10. A floating gate transistor for use as an EEPROM cell comprising:
    a P-type substrate having a DNwell configured for accepting an EEPROM cell;
    an EEPROM cell formed on the DNwell wherein the EEPROM cell is isolated from the P substrate by the DNwell and wherein the EEPROM cell has a floating gate; and
    a first SNwell defining a tunneling region within the DNwell;
    a capacitor disposed on the first SNwell;
    a second SNwell defining a control gate region within the DNwell;
    a control gate disposed on the second SNwell; and a floating gate operatively connecting the capacitor and control gate to a sense transistor disposed on the DNwell.

11. An EEPROM cell formed on a negatively biased substrate comprising:
    a P-type substrate;
    a DNwell formed on the substrate and defining a tunneling region, floating gate region, and control gate region, the DNwell electrically coupled to a fixed DC voltage;
    a first SNwell disposed on the tunneling region of the DNwell;
    a second SNwell disposed on the control gate region of the DNwell;
    a capacitor disposed on the first SNwell;
    a sense transistor disposed on the floating gate region of the DNwell;
    a control gate disposed on the second SNwell;
    an oxide layer disposed on the tunneling region, floating gate region, and control gate region of the DNwell; and
    a polysilicon floating gate disposed on the oxide layer operable to program the EEPROM cell.

12. A floating gate transistor for use as an EEPROM cell according to claim 11 wherein the width the floating gate portion of the DNwell is selected for resistance to charge transfer at an anticipated substrate negative bias level.

* * * * *